(12) United States Patent
Hsieh et al.

(10) Patent No.: US 9,966,434 B2
(45) Date of Patent: May 8, 2018

(54) MANUFACTURING METHOD OF SEMICONDUCTOR DEVICE

(71) Applicant: UNITED MICROELECTRONICS CORP., Hsin-Chu (TW)

(72) Inventors: Ming-Shiou Hsieh, Chiayi County (TW); Chun-Yao Yang, Kaohsiung (TW); Shi-You Liu, Kaohsiung (TW); Rong-Sin Lin, Taichung (TW); Han-Ting Yen, Yunlin County (TW); Yi-Wei Chen, Taichung (TW); I-Cheng Hu, Kaohsiung (TW); Yu-Shu Lin, Pingtung County (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/632,399

(22) Filed: Jun. 26, 2017

(65) Prior Publication Data
US 2017/0330937 A1    Nov. 16, 2017

Related U.S. Application Data

(62) Division of application No. 15/175,045, filed on Jun. 7, 2016, now Pat. No. 9,722,030.

(30) Foreign Application Priority Data

May 12, 2016    (CN) .......................... 2016 1 0313243

(51) Int. Cl.
*H01L 29/08* (2006.01)
*H01L 21/02* (2006.01)
(Continued)

(52) U.S. Cl.
CPC .... *H01L 29/0847* (2013.01); *H01L 21/02532* (2013.01); *H01L 21/02639* (2013.01);
(Continued)

(58) Field of Classification Search
CPC ............... H01L 29/0847; H01L 29/167; H01L 29/41783; H01L 29/7848; H01L 29/36;
(Continued)

(56) References Cited

U.S. PATENT DOCUMENTS 7,329,599 B1 *   2/2008  Wirbeleit .............. H01L 21/265
                                                                257/E21.199
8,901,537 B2    12/2014  Murthy et al.
(Continued)

*Primary Examiner* — Benjamin Sandvik
*Assistant Examiner* — Farid Khan
(74) *Attorney, Agent, or Firm* — Winston Hsu

(57) ABSTRACT

A semiconductor device includes a substrate including a plurality of transistor devices formed thereon, at least an epitaxial structure formed in between the transistor devices, and a tri-layered structure formed on the epitaxial structure. The epitaxial structure includes a first semiconductor material and a second semiconductor material, and a lattice constant of the second semiconductor material is larger than a lattice constant of the first semiconductor material. The tri-layered structure includes an undoped epitaxial layer, a metal-semiconductor compound layer, and a doped epitaxial layer sandwiched in between the undoped epitaxial layer and the metal-semiconductor compound layer. The undoped epitaxial layer and the doped epitaxial layer include at least the second semiconductor material.

8 Claims, 5 Drawing Sheets

(51) Int. Cl.
*H01L 29/165* (2006.01)
*H01L 29/36* (2006.01)
*H01L 21/265* (2006.01)
*H01L 21/324* (2006.01)
*H01L 29/167* (2006.01)
*H01L 21/283* (2006.01)
*H01L 21/768* (2006.01)
*H01L 21/8234* (2006.01)
*H01L 29/417* (2006.01)
*H01L 29/78* (2006.01)
*H01L 29/06* (2006.01)
*H01L 27/088* (2006.01)

(52) U.S. Cl.
CPC ...... *H01L 21/26513* (2013.01); *H01L 21/283* (2013.01); *H01L 21/324* (2013.01); *H01L 21/76897* (2013.01); *H01L 21/823425* (2013.01); *H01L 29/165* (2013.01); *H01L 29/167* (2013.01); *H01L 29/36* (2013.01); *H01L 29/41783* (2013.01); *H01L 29/7848* (2013.01); *H01L 27/0886* (2013.01); *H01L 29/0649* (2013.01)

(58) Field of Classification Search
CPC ........... H01L 29/165; H01L 21/823425; H01L 21/46897; H01L 21/283; H01L 21/324; H01L 21/26513; H01L 21/02532; H01L 21/02639

See application file for complete search history.

(56) References Cited

U.S. PATENT DOCUMENTS

| | | | |
|---|---|---|---|
| 8,994,104 B2* | 3/2015 | Glass | H01L 29/36 257/335 |
| 9,076,762 B2* | 7/2015 | Tsai | H01L 23/485 |
| 9,117,791 B2 | 8/2015 | Glass et al. | |
| 2014/0070377 A1* | 3/2014 | Yu | C30B 25/165 257/655 |

* cited by examiner

MANUFACTURING METHOD OF SEMICONDUCTOR DEVICE

CROSS REFERENCE TO RELATED APPLICATIONS

This application is a Divisional of application Ser. No. 15/175,045 filed Jun. 7, 2016, and included herein by reference.

BACKGROUND OF THE INVENTION

1. Field of the Invention

The present invention relates to a manufacturing method of a semiconductor device, and more particularly, to a manufacturing method of a semiconductor device including silicon/germanium hereinafter abbreviated as SiGe) alloy.

2. Description of the Prior Art

Transistor devices are essential and ubiquitous in modern electronics. These devices possess the simultaneous qualities of bistability, high switching speed, low power dissipation, high-reliability, and scalability to very small dimensions. Current integrated circuits (ICs) provide performance and complexity far beyond what was originally imagined. In order to achieve improvements in complexity and circuit density (i.e., the number of devices capable of being packed onto a given chip area), the size of each individual device in the circuit and the spacing between device elements (the feature size) must be decreased.

The individual elements of the circuits, metal-oxide-semiconductor field effect transistor (hereinafter abbreviated as MOSFET) devices and other passive and active circuit elements, must be interconnected by metal or other conductors to implement the desired circuit function. Some small resistance is associated with each contact between the conductor and the circuit element. As the feature size decreases, the contact resistance increases and becomes a greater and greater percentage of the total circuit resistance. As feature sizes decrease from 150 nanometers (nm) to 90 nm, then to 45 nm and below, the contact resistance becomes more and more important. At feature sizes of 32 nm, the contact resistance likely will dominate chip performance unless some innovation changes the present trend. It is therefore an imperative issue to reduce the contact resistance.

SUMMARY OF THE INVENTION

According to an aspect of the present invention, a semiconductor device is provided. The semiconductor device includes a substrate including a plurality of transistor devices formed thereon, at least an epitaxial structure formed in between the transistor devices, and a tri-layered structure formed on the epitaxial structure. The epitaxial structure includes a first semiconductor material and a second semiconductor material, and a lattice constant of the second semiconductor material is larger than a lattice constant of the first semiconductor material. The tri-layered structure further includes an undoped epitaxial layer, a metal-semiconductor compound layer, and a doped epitaxial layer sandwiched in between the undoped epitaxial layer and the metal-semiconductor compound layer. The undoped epitaxial layer and the doped epitaxial layer include at least the second semiconductor material.

According to an aspect of the present invention, a method for manufacturing a semiconductor device is provided. The method includes the following steps. A substrate including a plurality of transistor devices, a dielectric layer, and at least an epitaxial structure formed thereon is provided. The epitaxial structure is disposed in between the transistor devices. The epitaxial structure includes a first semiconductor material and a second semiconductor material, and a lattice constant of the second semiconductor material is larger than a lattice constant of the first semiconductor material. Next, at least an opening is formed in the dielectric layer between the transistor devices, and the epitaxial structure is exposed at a bottom of the opening. Thereafter, an undoped epitaxial layer is formed in the opening, and the undoped epitaxial layer includes at least the second semiconductor material. After forming the undoped epitaxial layer, a doped epitaxial layer is formed on the undoped epitaxial layer, and followed by forming a metal-semiconductor compound layer on the doped epitaxial layer.

According to the semiconductor device and the manufacturing method provided by the present invention, the tri-layered structure upwardly and sequentially including the undoped epitaxial layer, the doped epitaxial layer and the metal-semiconductor compound layer is formed on the epitaxial structure. More important, the undoped epitaxial layer, the doped epitaxial layer and the metal-semiconductor compound layer all include at least the second semiconductor material such as germanium (Ge). Consequently, contact resistance between the epitaxial structure and the contact plug, which is formed thereafter, is efficaciously reduced by the tri-layered structure and thus performance and the transistor devices and the whole IC(s) are improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are drawings illustrating a method for manufacturing semiconductor devices provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
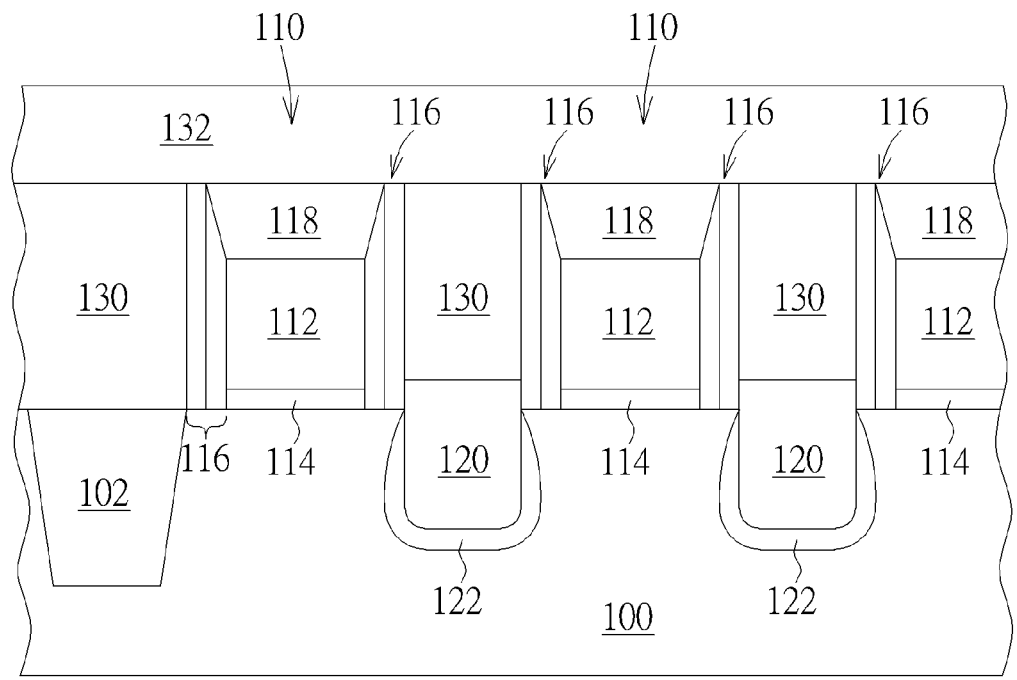

Please refer to FIGS. 1-8, which are schematic drawings illustrating semiconductor devices provided by a preferred embodiment of the present invention. As shown in FIG. 1, a substrate 100, such as a silicon substrate, a siliconcontaining substrate, or a silicon-on-insulator (hereinafter abbreviated as SOI) substrate is provided. A plurality of isolation structures 102 such as, for example but not limited to, shallow trench isolations (STIs) are formed in the substrate 100. The isolation structures 102 are provided to define regions for accommodating pMOS and/or nMOS transistor device and to render electrical isolations therebetween. In the preferred embodiment, a semiconductor layer such as a fin structure involved in fin field effect transistor (FinFET) approach can be provided. The fin structure can be formed by patterning a single crystalline silicon layer of a SOI substrate or a bulk silicon substrate by photolithographic etching pattern (PEP) method, multi patterning method, or, preferably, spacer self-aligned double-patterning (SADP), also known as sidewall image transfer (SIT) method. And the fin structure can be taken as the substrate 100 in the preferred embodiment. A plurality of transistor devices 110 are formed on the substrate 100. In embodiments of the present invention, the transistor devices 110 can be p-typed transistor devices and/or n-typed transistor devices depending on different requirements.

In the preferred embodiment, the replacement gate approach is integrated. Accordingly, the transistor devices 110 respectively include a metal gate 112 and a high-k gate dielectric layer 114. Furthermore, high-k first or high-k last approaches can be involved in different embodiments of the present invention. And an interfacial layer (IL) (not shown) can be formed in between the high-k gate dielectric layer 114 and the substrate 100 for providing a superior interface between the substrate 100 and the high-k gate dielectric layer 114. The metal gates 112 respectively include at least a work function metal layer (not shown) and a filling metal layer. In accordance with the preferred embodiment, the transistor devices 110 are p-typed transistor devices, and thus the work function metal layer can include any suitable metal material having a work function between about 4.8 eV and about 5.2 eV. Since the materials are well-known to those skilled in the art, those details are omitted herein in the interest of brevity. Additionally, the work function metal layer can be a single-layered or multi-layered structure. The filling metal layer includes a single-layered or a multi-layered structure with low resistance and superior gap-filling characteristic. Furthermore, the metal gates 112 can further include metal layers such as a bottom barrier layer (not shown), an etch stop layer (not shown), and/or a top barrier layer (not shown) respectively, if required. As shown in FIG. 1, an insulating cap layer 118 is formed on top surfaces of the metal gates 112. In some embodiments of the present invention, a width of the insulating cap layer 118 is larger than a width of the metal gate 112. Therefore, during forming contact openings in self-aligned contact (SAC) technique, the insulating cap layer 118 serves as a protecting shield obstructing the etchant and protecting the metal gate 112.

Please still refer to FIG. 1. According to the preferred embodiment, the transistor devices 110 respectively include lightly-doped drains (LDDs) (not shown), a spacer 116 formed on sidewall of the metal gate 112, and a source/drain (not shown). In other embodiments of the present invention, the spacer 116 can be a multi-layered structure as shown in FIG. 1, but not limited to this. More important, a selective epitaxial growth (SEG) method is used to form the source/drain in the embodiments of the present invention. For example, since the transistor devices 110 are the p-typed transistor devices in the preferred embodiment, at least an epitaxial structure 120 are formed in between the transistor devices 110. The epitaxial structure 120 includes a first semiconductor material and a second semiconductor material, and a lattice constant of the second semiconductor material is larger than a lattice constant of the first semiconductor material. For example, the first semiconductor material is silicon (Si) and the second semiconductor material is Ge. In other words, the preferred embodiment includes SiGe epitaxial structure to form the source/drain. Additionally, in the embodiments of the present invention, a thickness of the epitaxial structure 120 can be 450 angstroms (Å). And a concentration of the second semiconductor material in the epitaxial structure 120 can be between 32% and 46%, but not limited to this. It should be well-known to those skilled in the art that the epitaxial structure 120 can include dopants such as boron (B), and B concentration in the epitaxial structure 120 can be $6E20cm^{-3}$, but not limited to this. Additionally, as shown in FIG. 1, a top surface of the epitaxial structure 120 is higher than a top surface of the substrate 100, but not limited to this.

It is noteworthy that in some embodiments of the present invention, the epitaxial structure 120 can include a multiple structure. Such epitaxial structure can further include a first structure 120 and a second structure 122. The first structure 120 serves as the main stress provider while the second structure 122 is provided to reduce contact resistance between the first structure 120 and ambience material. Accordingly, the second structure 122 can also include the first semiconductor material and the second semiconductor material. That is, the second structure 122 also includes SiGe. However, a concentration of the second semiconductor material in the second structure 122 is preferably lower than a concentration of the second semiconductor material in the first structure 120 for preventing the first structure 120 from dislocation defects. A thickness of the second structure 122 can be between 72 Å and 88 Å, but not limited this. It should be well-known to those skilled in the art that the epitaxial structure 120 can include dopant(s) such as boron fluoride (BF), but not limited to this.

Please still refer to FIG. 1. A dielectric layer 130/132 is formed on the substrate 100. In the preferred embodiment of the present invention, the dielectric layer 130/132 serves as an inter-layer dielectric (ILD) layer. As shown in FIG. 1, the transistor devices 110 are embedded in the dielectric layer 130. In detail, the dielectric layer 130 embeds and surrounds the transistor devices 110 while the dielectric layer 132 covers both the transistor devices 110 and the dielectric layer 130, but not limited to this.

Figure 2:
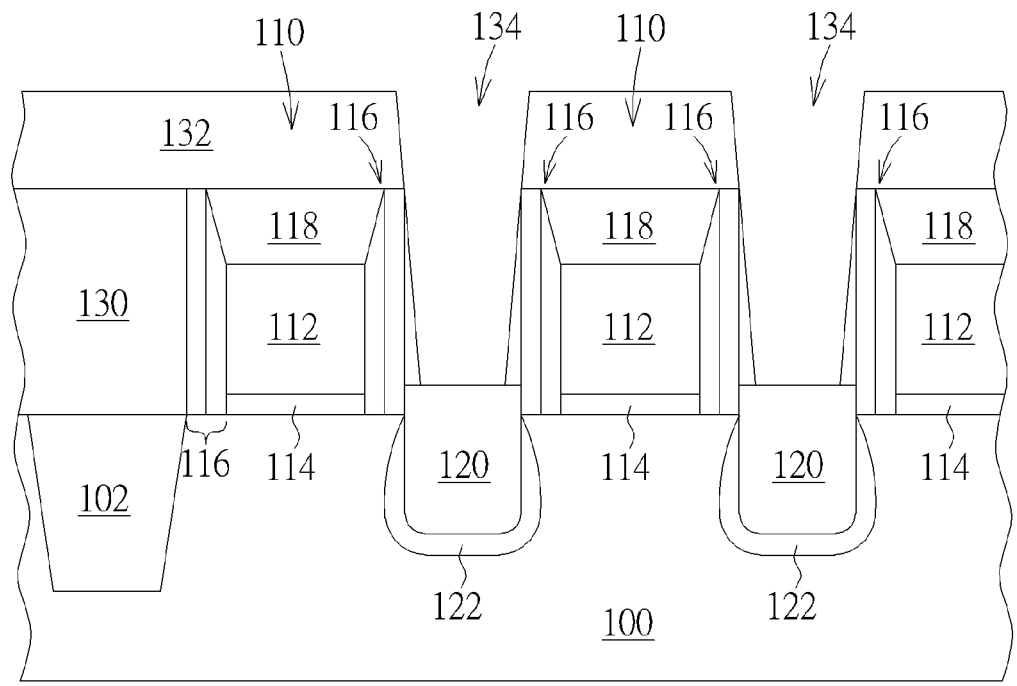

Please refer to FIG. 2. Next, at least an opening 134 is formed in the dielectric layer 132/130. It is noteworthy that the opening 134 is formed in between the transistor devices 110 and the epitaxial structure 120 is exposed at a bottom of the opening 134. The opening 134 can be a SAC opening, but not limited to this. Additionally, as shown in FIG. 2, a width of the opening 134, particularly speaking, a width of the bottom of the opening 134 is smaller than a width of the epitaxial structure 120, but not limited to this.

Figure 3:
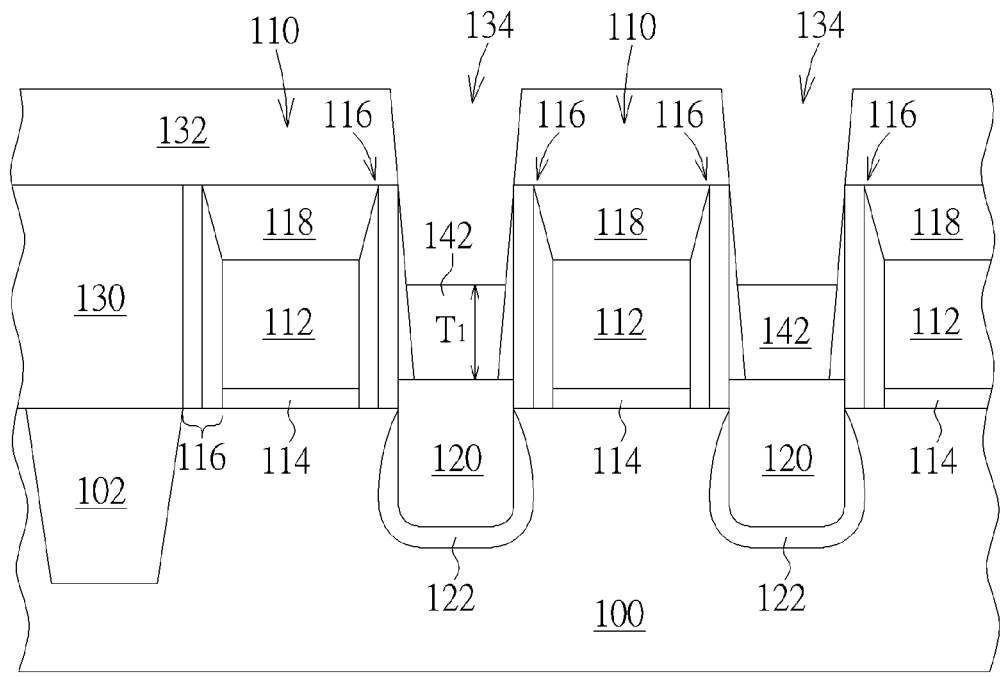

Please refer to FIG. 3. After forming the opening 134, an undoped epitaxial layer 142 is formed in the opening 134 by performing a SEG method. The undoped epitaxial layer 142 includes a first thickness $T_1$, the first thickness $T_1$ is about 50 Å, but not limited to this. According to an embodiment of the present invention, the undoped epitaxial layer 142 includes at least the second semiconductor material such as Ge. It is noteworthy that the second semiconductor material in the undoped epitaxial layer 142 includes a concentration, and the concentration is between 50% and 100%. Furthermore, the undoped epitaxial layer 142 can include the first semiconductor material such as Si, and a Si concentration in the undoped epitaxial layer 142 is between 50% and 0%. It is noteworthy that the Ge concentration and the Si concentration in the undoped epitaxial layer 142 are correlated. In some embodiments of the present invention, the Ge concentration in the undoped epitaxial layer 142 is 100%, and the Si concentration is 0%. Furthermore, the concentration of the second semiconductor material in the undoped epitaxial layer 142 can be fixed or upwardly increased. For example, the Ge concentration in the undoped epitaxial layer 142 can be fixed to 100% in some embodiments of the present invention, and, alternatively, upwardly increased from 50% to 100% in other embodiments of the present invention. It is concluded that the undoped epitaxial layer 142 is a high-Ge content layer compared to the epitaxial structure 120 underneath.

Figure 4:
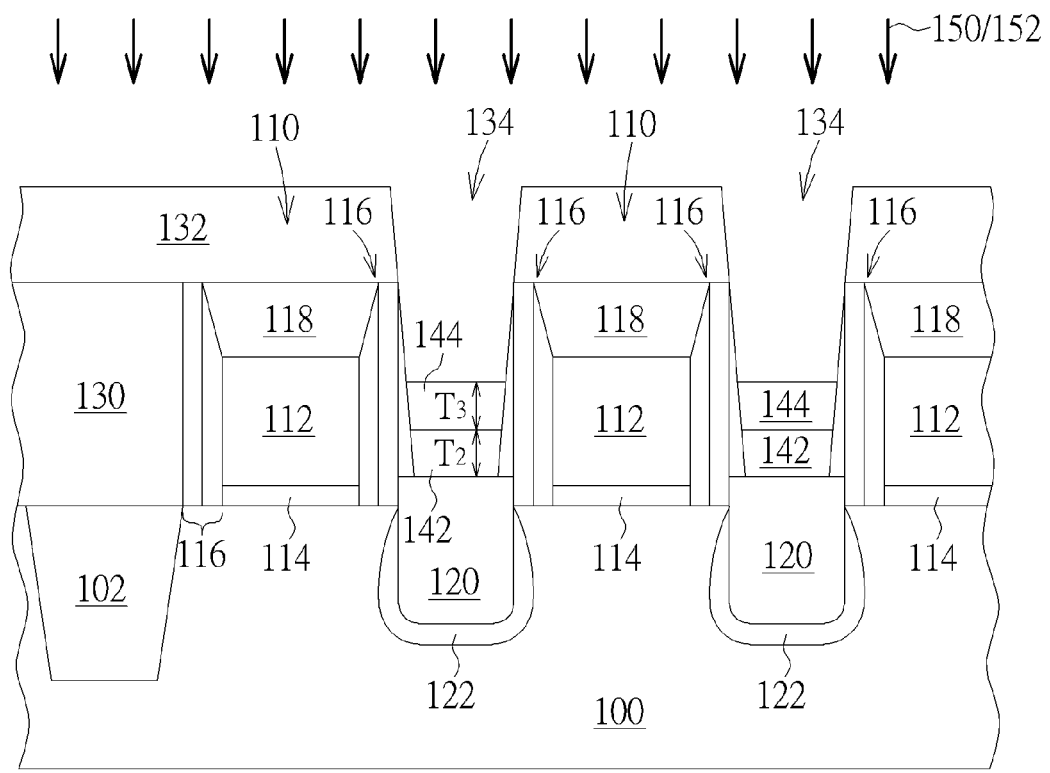

Please refer to FIG. 4. After forming the undoped epitaxial layer 142, an ion implantation 150 and a thermal treatment 152 are sequentially performed. The ion implantation 150 is to implant dopant(s) into the undoped epitaxial layer 142 and the thermal treatment 152 is to diffuse the dopant(s). Consequently, a doped epitaxial layer 144 is formed in the undoped epitaxial layer 142. In some embodiments of the present invention, boron is doped into the undoped epitaxial layer 142, and a concentration of boron is about $1E20cm^{-3}$, but not limited to this. The thermal treatment 152 can be any suitable thermal technique such as, for example but not limited to, dynamic surface anneal (DSA). It is noteworthy that the dopants are diffused downwardly from the surface it entered. Therefore the obtained doped epitaxial layer 144 is taken as to be formed on the undoped epitaxial layer 142, as shown in FIG. 4. Accordingly, the undoped epitaxial layer 142 includes the first thickness $T_1$ before the thermal treatment 152, and it includes a second thickness $T_2$ after the thermal treatment 152. And the second thickness $T_2$ is smaller than the first thickness $T_1$. On the other hand, the doped epitaxial layer 144 includes a third thickness $T_3$, and a sum of the third thickness $T_3$ of the doped epitaxial layer 144 and the second thickness $T_2$ of the undoped epitaxial layer 142 equals to the first thickness $T_1$ of the undoped epitaxial layer 142. In some embodiments of the present invention, the third thickness $T_3$ of the doped epitaxial layer 144 can be larger than 30 Å but smaller than 50 Å.

Figure 5:
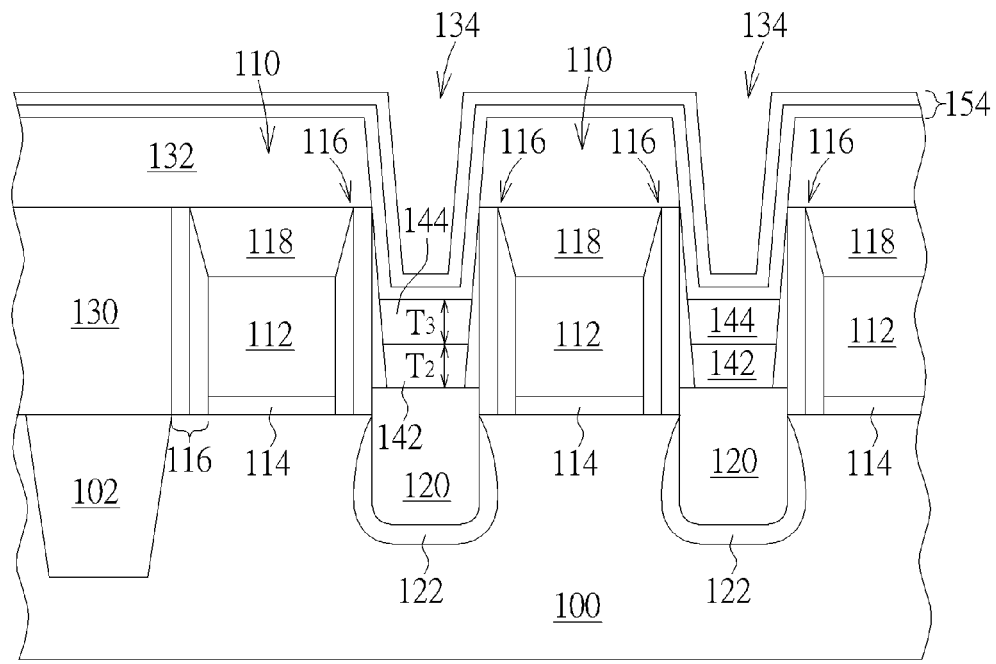

Please refer to FIG. 5. After forming the doped epitaxial layer 144, a metal layer 154 is formed on the substrate 100 and particularly on the doped epitaxial layer 144 in the opening 134 in the dielectric layer 130/132. In some embodiments of the present invention, the metal layer 154 includes a Ti/TiN dual-layered structure, but not limited to this.

Figure 6:
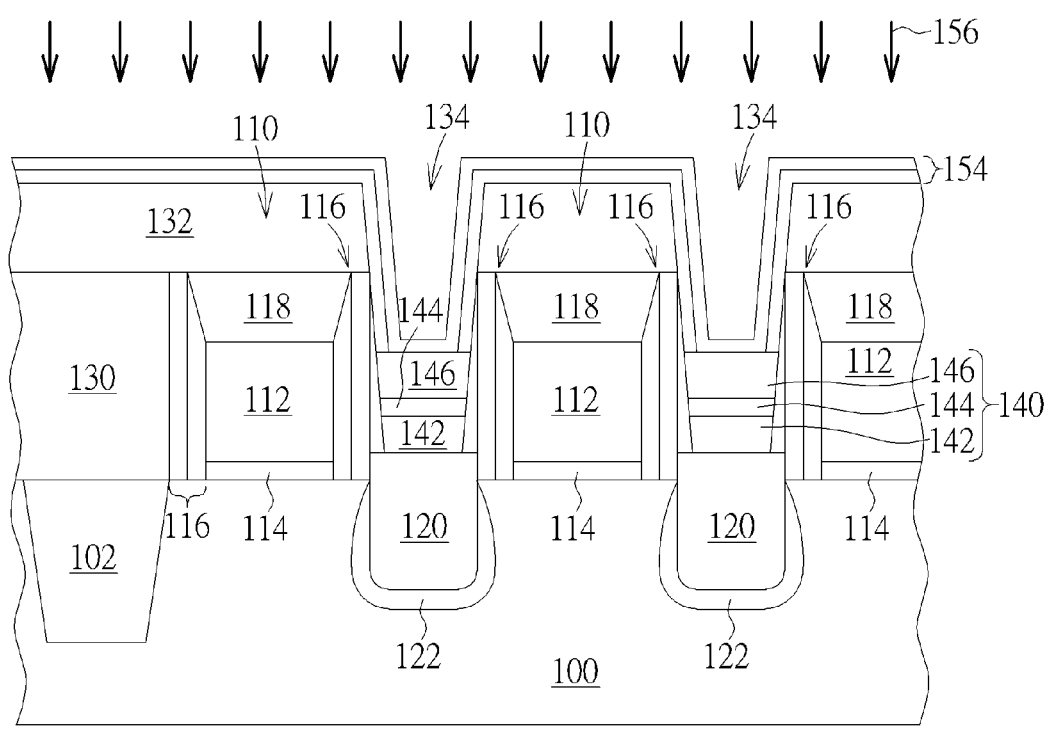

Please refer to FIG. 6. After forming the metal layer 154, a thermal treatment 156 is performed to form a metal-semiconductor compound layer 146. It is noteworthy that during the thermal treatment 156, the metal material in the metal layer 154 reacts with Ge in the doped epitaxial layer 144, and thus the metal-semiconductor compound layer 146 can be a metal germanide layer, such as a titanium germanide (TiGe) layer. Accordingly, a tri-layered structure 140 is formed on the epitaxial structure 120, and the tri-layered structure 140 includes the metal-semiconductor compound layer 146, the undoped epitaxial layer 142 and the doped epitaxial layer 144 sandwiched in between the metal-semiconductor compound layer 146 and the undoped epitaxial layer 142. A width of the tri-layered structure 140, particularly speaking a width of a bottom of the tri-layered structure 140 is smaller than the width of the epitaxial structure 120 as shown in FIG. 6.

Figure 7:
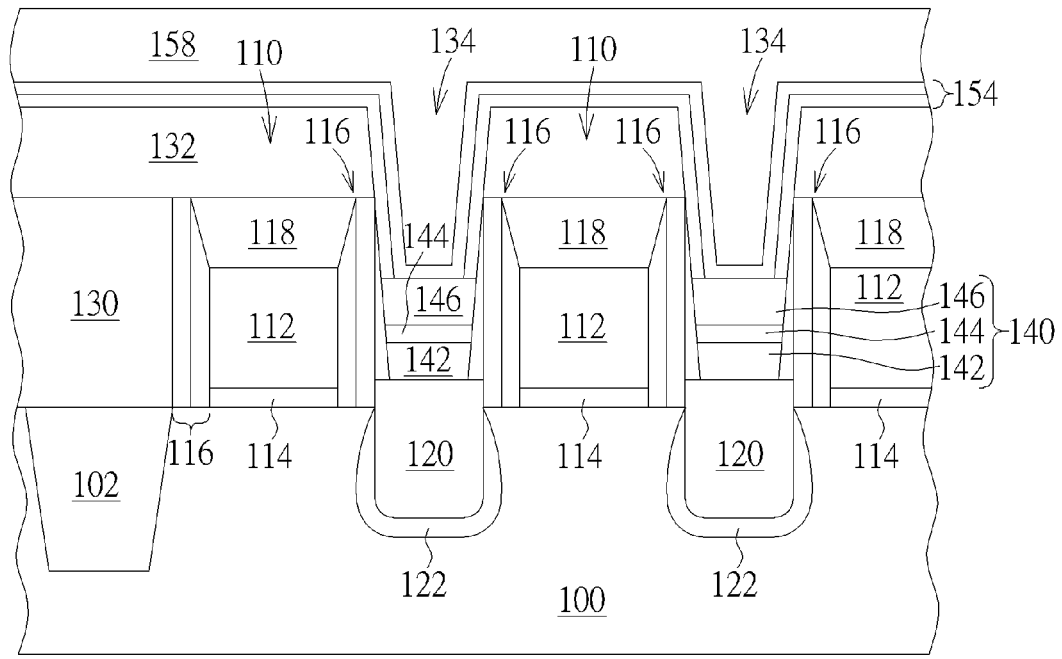

Please refer to FIG. 7. After forming the metal-semiconductor compound layer 146, that is after obtaining the tri-layered structure 140, the opening 134 is filled up with a metal layer 158 such as, for example but not limited to, a tungsten (W) layer 158.

Figure 8:
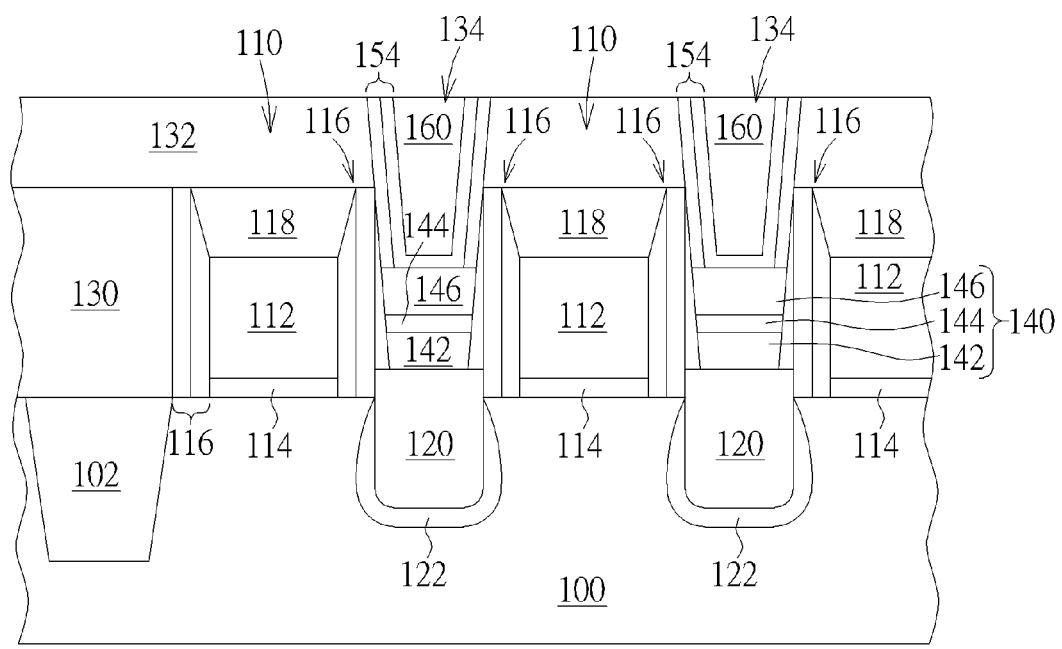

Please refer to FIG. 8. Next, a planarization process such as a chemical mechanical polishing (CMP) process is performed to remove superfluous metal layer 158. Consequently, a metal contact plug 160 is respectively formed in the openings 134. The metal contact plug 160 is formed in the dielectric layer 130/132. Specifically, the metal contact plug 160 is formed in between the transistor devices 110. As shown in FIG. 8, the metal layer 154 still remains between a sidewall of the metal contact plug 160 and the dielectric layer 130/132, and between the sidewall of the metal contact plug 160 and the transistor devices 110. More important, the tri-layered structure 140 is sandwiched in between the metal contact plug 160 and the epitaxial structure 120.

Figure 9:
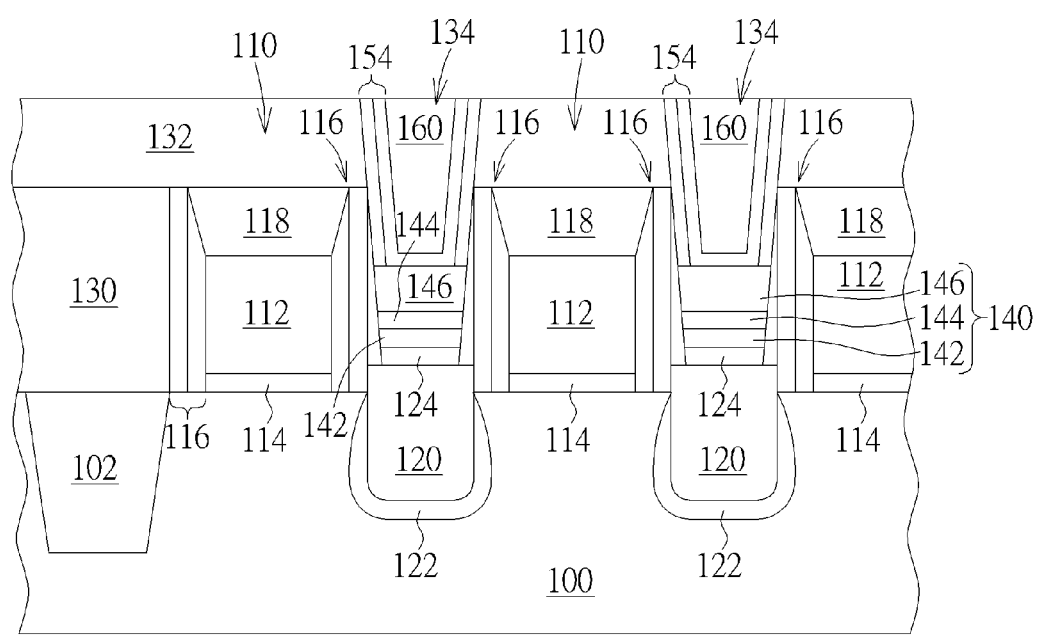
FIG. 9 is a schematic drawing illustrating a semiconductor device provided by a modification of the present invention.

Please refer to FIG. 9, which is a schematic drawing illustrating a semiconductor device provided by a modification of the present invention. Please note that elements the same in the modification and the abovementioned embodiment are designated by the same numerals and can be formed by the same processes. Furthermore, those elements the same in both the modification and the abovementioned embodiment can include the same material choice. Therefore those details are omitted in the interest of brevity. The difference between the modification and the abovementioned embodiment is: A cap layer 124 is sandwiched in between the epitaxial structure 120 and the tri-layered structure 140. A thickness of the cap layer 124 is between 70 Å and 85 Å. The cap layer 124 can include the first semiconductor material and the second semiconductor material. Therefore the cap layer 124 can be a SiGe layer. Furthermore, a concentration of the second semiconductor material in the cap layer 124 can be 25%, but not limited to this. Additionally, the cap layer 124 can include the abovementioned dopants, that are boron (B), and the B concentration in the SiGe layer 124 can be $8E20cm^{-3}$, but not limited to this.

According to the semiconductor device and the manufacturing method provided by the present invention, the tri-layered structure upwardly and sequentially including the undoped epitaxial layer, the doped epitaxial layer and the metal-semiconductor compound layer is formed between the epitaxial structure and the metal contact plug. More important, the undoped epitaxial layer, the doped epitaxial layer and the metal-semiconductor compound layer all include at least the second semiconductor material with high concentration. That is, the undoped epitaxial layer, the doped epitaxial layer and the metal-semiconductor compound layer all are high-Ge content layers. Consequently, contact resistance between the epitaxial structure and the metal contact plug is efficaciously reduced by the tri-layered structure and thus performance and the transistor devices and the whole IC(s) are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device, comprising:

providing a substrate comprising a plurality of transistor devices, a dielectric layer, and at least an epitaxial structure formed thereon, the epitaxial structure being disposed in between the transistor devices and comprising a first semiconductor material and a second semiconductor material, and a lattice constant of the second semiconductor material being larger than a lattice constant of the first semiconductor material;

forming at least an opening in the dielectric layer between the transistor devices, and the epitaxial structure being exposed at a bottom of the opening;

forming an undoped epitaxial layer in the opening, and the undoped epitaxial layer comprising at least the second semiconductor material;

forming a doped epitaxial layer on the undoped epitaxial layer; and forming a metal-semiconductor compound layer on the doped epitaxial layer.

2. The method for manufacturing the semiconductor device according to claim 1, wherein the second semiconductor material in the undoped epitaxial layer comprises a concentration, and the concentration is between 50% and 100%.

3. The method for manufacturing the semiconductor device according to claim 1, wherein the step of forming the doped epitaxial layer further comprises:

performing an ion implantation to implant a dopant into the undoped epitaxial layer; and performing a thermal treatment to form the doped epitaxial layer.

4. The method for manufacturing the semiconductor device according to claim 3, wherein the undoped epitaxial layer comprises a first thickness before the thermal treatment and a second thickness after the thermal treatment, and the second thickness is smaller than the first thickness.

5. The method for manufacturing the semiconductor device according to claim 3, wherein the dopant comprises boron.

6. The method for manufacturing the semiconductor device according to claim 1, wherein the step of forming the metal-semiconductor compound layer further comprises:

forming a metal layer on the doped epitaxial layer; and performing a thermal treatment to form the metal-semiconductor compound layer.

7. The method for manufacturing the semiconductor device according to claim 1, wherein a width of the opening is smaller than a width of the epitaxial structure.

8. method for manufacturing the semiconductor device according to claim 1, further comprising a step of forming a metal contact plug in the opening after forming the metal-semiconductor compound layer.

* * * * *